US012740460B2

(12) United States Patent
Darmawikarta et al.

(10) Patent No.: US 12,740,460 B2
(45) Date of Patent: Sep. 15, 2026

(54) APPARATUS AND METHOD FOR ELECTROLESS SURFACE FINISHING ON GLASS

(71) Applicant: Intel Corporation, Santa Clara, CA (US)

(72) Inventors: Kristof Darmawikarta, Chandler, AZ (US); Steve S. Cho, Chandler, AZ (US); Hiroki Tanaka, Gilbert, AZ (US); Haobo Chen, Chandler, AZ (US); Gang Duan, Chandler, AZ (US); Brandon Christian Marin, Gilbert, AZ (US); Suddhasattwa Nad, Chandler, AZ (US); Srinivas V. Pietambaram, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/065,250

(22) Filed: Dec. 13, 2022

(65) Prior Publication Data

US 2024/0194548 A1 Jun. 13, 2024

(51) Int. Cl.

| | |
|---|---|
| ***H01L 23/15*** | (2006.01) |
| ***C23C 18/16*** | (2006.01) |
| ***C23C 18/18*** | (2006.01) |
| ***C23C 18/48*** | (2006.01) |
| ***H01L 21/48*** | (2006.01) |
| ***H01L 23/00*** | (2006.01) |
| ***H01L 23/498*** | (2006.01) |
| ***H01L 25/065*** | (2023.01) |
| ***H10W 70/05*** | (2026.01) |

(Continued)

(52) U.S. Cl.

CPC ....... *H10W 70/692* (2026.01); *C23C 18/1639* (2013.01); *C23C 18/165* (2013.01); *C23C 18/1855* (2013.01); *C23C 18/48* (2013.01); *H10W 70/05* (2026.01); *H10W 70/095* (2026.01); *H10W 70/65* (2026.01); *H10W 70/66* (2026.01); *H10W 70/685* (2026.01); *H10W 90/00* (2026.01); *H10W 70/60* (2026.01); *H10W 70/655* (2026.01); *H10W 90/724* (2026.01)

(58) Field of Classification Search

CPC ... H10W 70/05; H10W 70/095; H10W 70/60; H10W 70/65; H10W 70/655; H10W 70/66; H10W 70/685; H10W 70/683; H10W 90/00; H10W 90/724; C23C 18/1639; C23C 18/165; C23C 18/1855; C23C 18/48; H05K 1/113; H05K 1/115

See application file for complete search history.

(56) References Cited

U.S. PATENT DOCUMENTS

2015/0245473 A1* 8/2015 Shimizu ............... H05K 1/0298 29/850

2021/0227691 A1* 7/2021 Yugawa .................. H05K 1/09

(Continued)

*Primary Examiner* — David C Spalla

(74) *Attorney, Agent, or Firm* — Alliance IP, LLC

(57) ABSTRACT

Apparatus and methods for electroless surface finishing on glass. The apparatus comprises a dielectric layer having an upper surface that is characterized by surface variations of less than plus or minus 5 microns and a glass core located under the dielectric layer. Planarity is characterized by having surface variations of less than about 5 microns, as measured by recesses and/or protrusions. The apparatus further includes conductive elements formed by an electroless NiPdAu process.

20 Claims, 13 Drawing Sheets

(51) Int. Cl.

| | |
|---|---|
| ***H10W 70/65*** | (2026.01) |
| ***H10W 70/66*** | (2026.01) |
| ***H10W 70/685*** | (2026.01) |
| ***H10W 70/692*** | (2026.01) |
| ***H10W 90/00*** | (2026.01) |
| *H10W 70/60* | (2026.01) |
| *H10W 70/655* | (2026.01) |

(56) References Cited

U.S. PATENT DOCUMENTS

| | | | | |
|---|---|---|---|---|
| 2022/0020713 | A1* | 1/2022 | Jun | H10W 90/00 |
| 2023/0209707 | A1* | 6/2023 | Kim | H05K 1/0298 174/251 |
| 2024/0071990 | A1* | 2/2024 | Boo | H10W 70/05 |

* cited by examiner

X
Z 452
206
202
310
526
208
204
310
208
204
310
208
500

452
206
202
IC 1
528
310
208
204
528
310
208
528
310
204
208
550

1300

PROCESSOR UNIT 1302

COMMUNICATION COMPONENT 1312

MEMORY 1304

BATTERY/POWER 1314

DISPLAY DEVICE 1306

GNSS DEVICE 1318

AUDIO OUTPUT DEVICE 1308

AUDIO INPUT DEVICE 1324

AN OTHER OUTPUT DEVICE 1310

AN OTHER INPUT DEVICE 1320

ANTENNA 1322

APPARATUS AND METHOD FOR ELECTROLESS SURFACE FINISHING ON GLASS

BACKGROUND

For a variety of reasons, glass is expected to improve the mechanical and electrical performance of semiconductor substrate packages over other core materials. However, glass can be fragile, and its presence in a substrate package can introduce a variety of technical challenges and reliability issues. Accordingly, improved methods and architectures that can be used with substrates having glass layers are desired.

DETAILED DESCRIPTION

Figure 1:
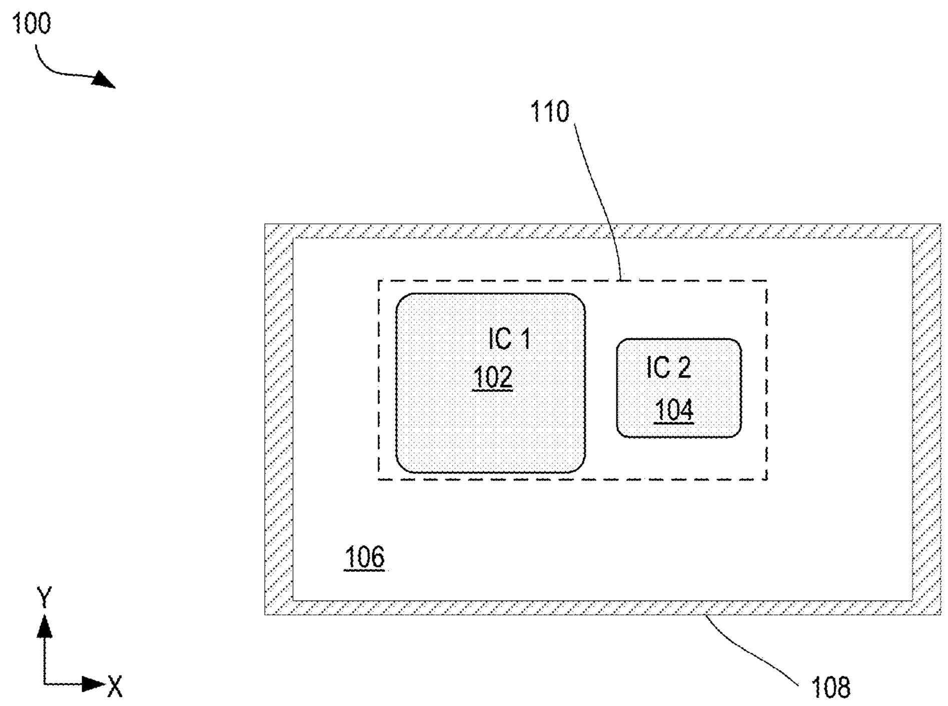
FIG. 1 illustrates an example semiconductor package that implements an apparatus with electroless surface finishing on glass, in accordance with various embodiments.

The rigidity of glass and its ability to provide a planar surface is expected to impart mechanical and electrical improvements to a substrate package over other core materials. However, glass can be brittle, and some desirable fabrication processes are technically challenging with glass. For example, implementing an electroless (also, "eless") Nickel electroless Palladium immersion Gold (also referred to as electroless NiPdAu, or "ENEPIG") to create a final coating/protection layer for exposed metal contacts at the end of line (i.e., final surface traces and contacts) can be technically challenging. ENEPIG is technically challenging for semiconductor substrate packages because ENEPIG generally employs a shock and sway process to ensure that complete coverage in the solder resist openings on the substrate surface has been achieved. These processes often include a violent mechanical agitation, which can potentially shatter the glass core material.

A proposed solution is to implement an electrolytic (in contrast to electroless) NiPdAu process. However, there are technical challenges to the integration of electrolytic surface finishing, such as, issues with achieving appropriate interface adhesion and overlay margins. Consequently, there are reliability concerns regarding using an electrolytic NiPdAu process. For at least these reasons, improvements to semiconductor package architectures that enable the use of ENEPIG with glass core substrate packages are desired.

Embodiments described herein provide a technical solution to these technical challenges in the form of an apparatus with electroless surface finishing on substrates with glass, and methods for producing same. The provided apparatus and methods can be used in semiconductor packaging processes and devices. Embodiments use a planarization process, an etch-back process, or any via reveal method to create a flatter, more planar, substrate surface, and then perform the ENEPIG coating. As used herein, the flatter, planar substrate surface is defined as any/all surface variations being less than about +/−5 microns (e.g., surface variations include recesses and/or protrusions). Advantageously, the flatter surface can remove the requirement for the shock/sway agitation process that may otherwise be required to ensure that complete coverage in the solder resist openings on the substrate surface has been achieved. Accordingly, embodiments enable use of a standard process for electroless NiPdAu for glass-core substrate packages, devices, and products. These concepts are developed in more detail below.

Example embodiments are hereinafter described in conjunction with the following drawing figures, wherein like numerals denote like elements. Figures are not necessarily to scale but may be relied on for spatial orientation and relative positioning of features. As may be appreciated, certain terminology, such as "ceiling" and "floor", as well as "upper,", "uppermost", "lower," "above," "below," "bottom," and "top" refer to directions based on viewing the Figures to which reference is made. Further, terms such as "front," "back," "rear,", "side", "vertical", and "horizontal" may describe the orientation and/or location of portions of the component within a consistent but arbitrary frame of reference which is made clear by reference to the text and the associated Figures describing the component under discussion. Such terminology may include the words specifically mentioned above, derivatives thereof, and words of similar import.

As used herein, the term "adjacent" refers to layers or components that are in direct physical contact with each other, with no layers or components in between them. For example, a layer X that is adjacent to a layer Y refers to a layer that is in direct physical contact with layer Y. In contrast, as used herein, the phrase(s) "located on" (in the alternative, "located under," "located above/over," or "located next to," in the context of a first layer or component located on a second layer or component) includes (i) configurations in which the first layer or component is directly physically attached to the second layer (i.e., adjacent), and (ii) configurations in which the first layer or component is attached (e.g. coupled) to the second layer or component via one or more intervening layers or components.

Terms or values modified by the word "substantially" include arrangements, orientations, spacings, or positions that vary plus or minus 20% from the meaning of the unmodified term or value. Terms or values modified by the word "about" include values inclusive of 10% less than the term or value to inclusive of 10% greater than the term or value.

As used herein, the term "electronic component" can refer to an active electronic circuit (e.g., processing unit, memory, storage device, FET) or a passive electronic circuit (e.g., resistor, inductor, capacitor).

As used herein, the term "integrated circuit component" can refer to an electronic component configured on a semiconducting material to perform a function. An integrated circuit (IC) component can comprise one or more of any computing system components described or referenced herein or any other computing system component, such as a processor unit (e.g., system-on-a-chip (SoC), processor core, graphics processor unit (GPU), accelerator, chipset processor), I/O controller, memory, or network interface controller, and can comprise one or more additional active or passive devices such as capacitors, decoupling capacitors, resistors, inductors, fuses, diodes, transformers, sensors, electrostatic discharge (ESD) devices, and memory devices.

A non-limiting example of an unpackaged integrated circuit component includes a single monolithic integrated circuit die (shortened herein to "die"); the die may include solder bumps attached to contacts on the die. When present on the die, the solder bumps or other conductive contacts can enable the die to be directly attached to a printed circuit board (PCB) or other substrates.

A non-limiting example of a packaged integrated circuit component comprises one or more integrated circuit dies mounted on a package substrate with the integrated circuit dies and package substrate encapsulated in a casing material, such as a metal, plastic, glass, or ceramic. Often the casing includes an integrated heat spreader (IHS); the packaged integrated circuit component often has bumps, leads, or pins attached to the package substrate (either directly or by wires attaching the bumps, leads, or pins to the package substrate) for attaching the packaged integrated circuit component to a printed circuit board (or motherboard or base board) or another component.

The following detailed description is not intended to limit the application and use of the disclosed technologies. It may be evident that the novel embodiments can be practiced without every detail described herein. For the sake of brevity, well-known structures and devices may be shown in block diagram form to facilitate a description thereof.

The non-limiting example in FIG. 1 is a semiconductor package 100 that comprises a first integrated circuit (IC) die (IC 1) 102 and a second integrated circuit die (IC 2) 104. The die are attached to a substrate 110 that may be configured to provide inter-die and intra-die connections and traces, via any of a variety of methods. As may be appreciated, this arrangement of die in a semiconductor package 100 is just one example embodiment, in other semiconductor packages, there may be more or less IC die, the die may be arranged in any pattern (e.g., square (e.g., 2×2, 4×4, 6×6), rectangular (e.g., 2×4, 3×5, 4×7)), stacked (three-dimensionally), or the like. In various embodiments, the substrate 110 may comprise a printed circuit board, thin-film substrate, or another suitable substrate. In other embodiments, the substrate 110 may further be attached to a printed circuit board (PCB) 106.

In various embodiments, the die in the semiconductor package 100 can be overmolded with an encapsulant 108. The encapsulant 108 can comprise a molding compound, dielectric materials, metal, ceramic, plastic, or a combination thereof. Additionally, a thermal management solution (not shown) comprising a cooling component such as a vapor chamber, heat pipe, heat sink, or liquid-cooled cold plate may be attached to a semiconductor package 100. As part of a thermal management solution, a thermal conduction layer interface material (TIM) may be located over the die 102 and/or die 104. The TIM can be any suitable material, such as a silver particle-filled thermal compound, thermal grease, phase change materials, indium foils, or graphite sheets. The thermal management solution can be a conformal solution that accommodates differences in heights of the integrated circuit dies for which the thermal management solution provides cooling. For example, a thermal management solution can comprise a substantially planar cooling component with TIMs of varying thickness between the cooling component and the integrated circuit dies. In another example, the cooling component is non-planar, and the profile of the cooling component can vary with the thickness of the integrated circuit dies for which the cooling component provides cooling. In such embodiments, the TIM can be of substantially uniform thickness between the cooling component and the integrated circuit dies of varying thicknesses. Thermal management solutions can also include an integrated heat spreader.

The die 102 and 104 may be unpackaged integrated circuit die, and may alternatively be referred to as chips, chiplets, chip complexes, or chiplet complexes. While the terms die, chip, and chiplet may be used interchangeably, the term chiplet is sometimes used to refer to an integrated circuit die that implements a subset of the functionality of a larger integrated circuit component. The chiplet dimensions (lateral dimensions, as well as thicknesses) and shape can vary among chiplets; moreover, the chiplets may vary by pinout, pitch, type/functionality (e.g., compute, memory, I/O, power management (controlling the delivery of power and/or providing power to components)). Any integrated circuit die, chip, or chiplet can implement any portion of the functionality of any processor unit described or referenced herein. Furthermore, a semiconductor package 100 can have any shape, such as a substantially square shape, substantially rectangular shape, or substantially circular shape.

Figure 8:
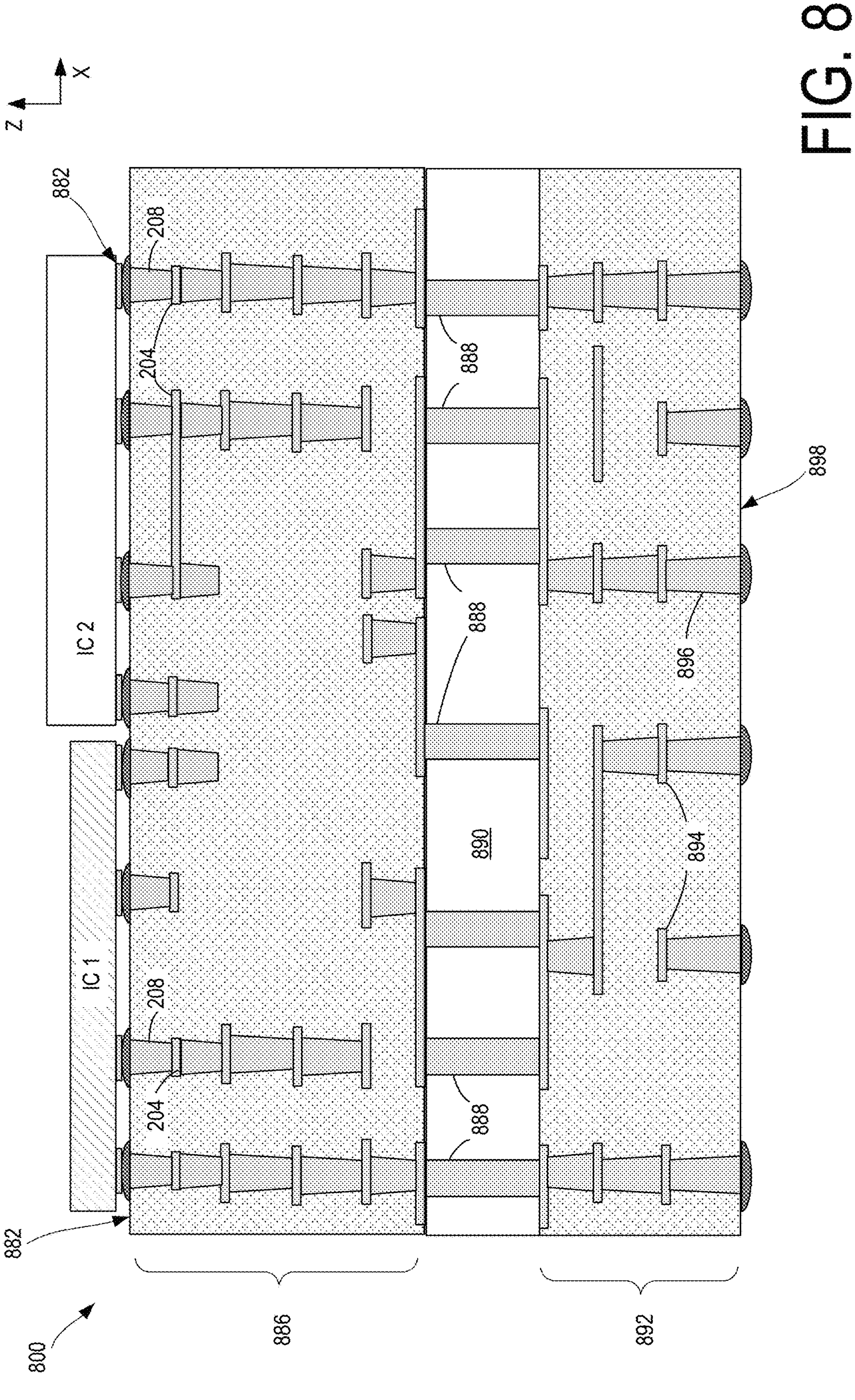
Figure 9:
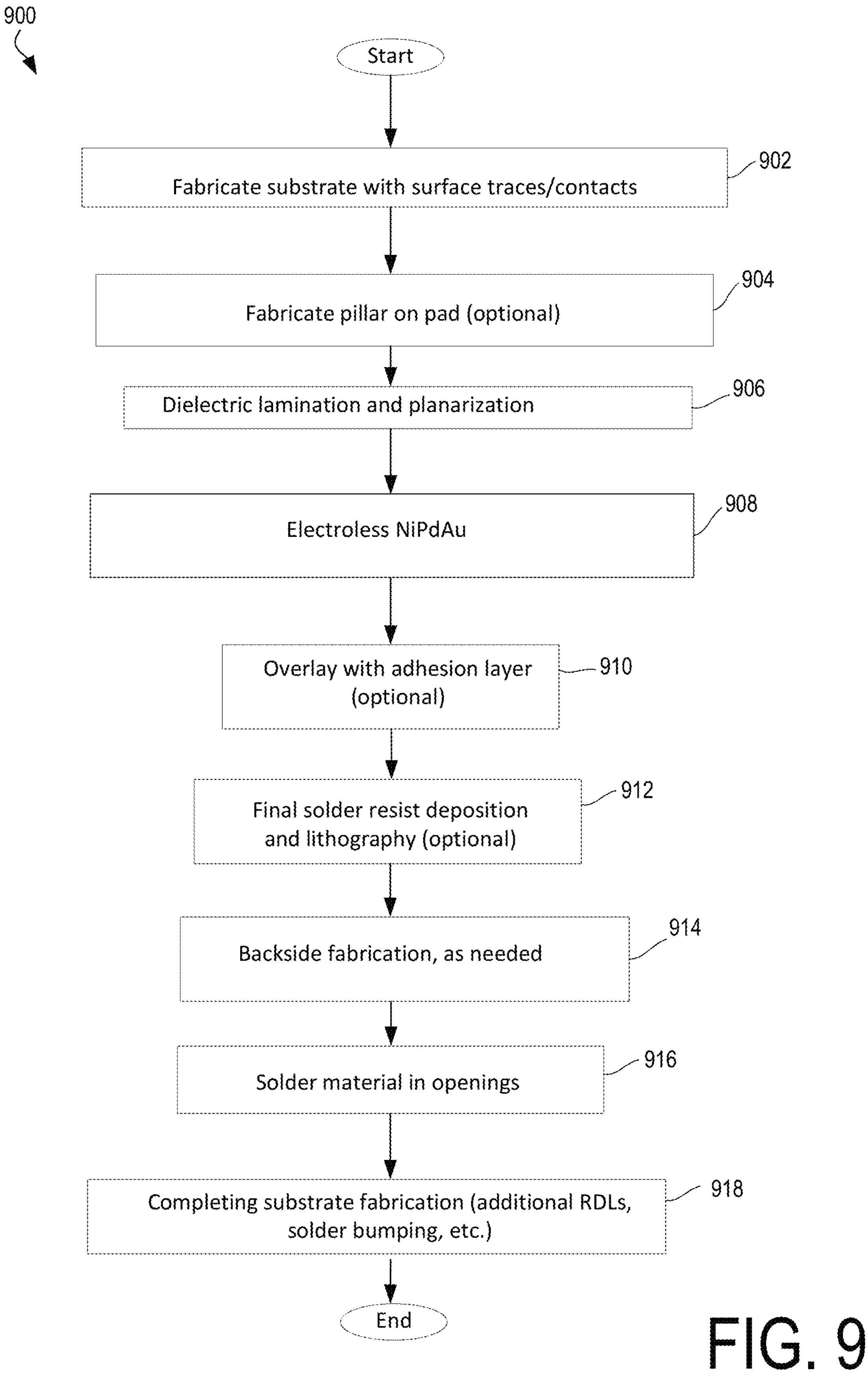
FIG. 9 illustrates an example method for manufacturing and implementing an apparatus with electroless surface finishing on glass, in accordance with various embodiments.

The substrate package 110 includes an embodiment of an apparatus for electroless surface finishing on glass. FIGS. 2-7 provide various stages of fabrication of an apparatus for electroless surface finishing on glass. FIG. 8 expands on the embodiments of FIGS. 2-7, depicting a more complex build-up dielectric that has multiple redistribution layers therein. FIG. 9 provides a process flow for creating embodiments described herein.

Figure 2:
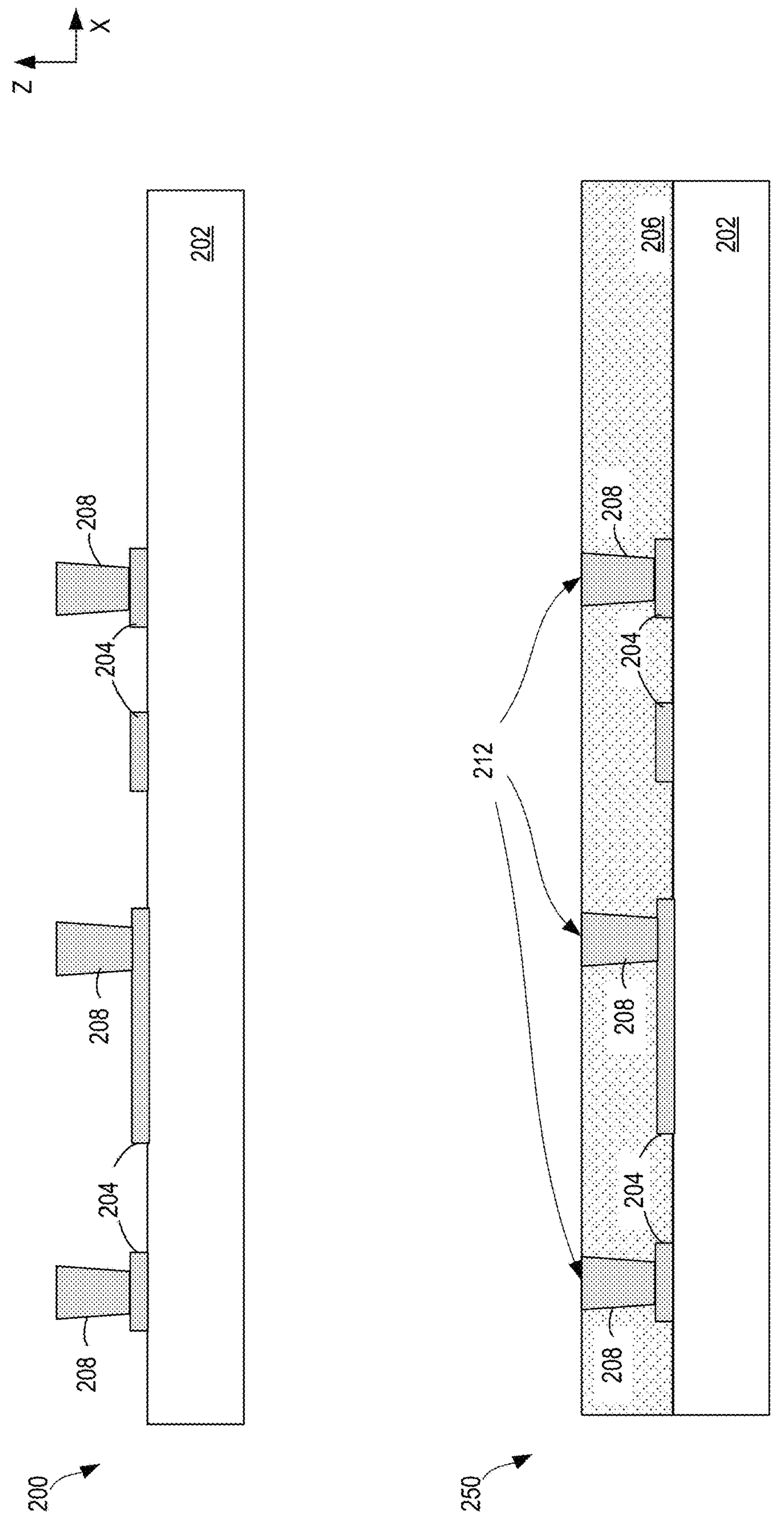
FIGS. 2-8 provide various stages of fabrication of an apparatus with electroless surface finishing on glass.
Figure 3:
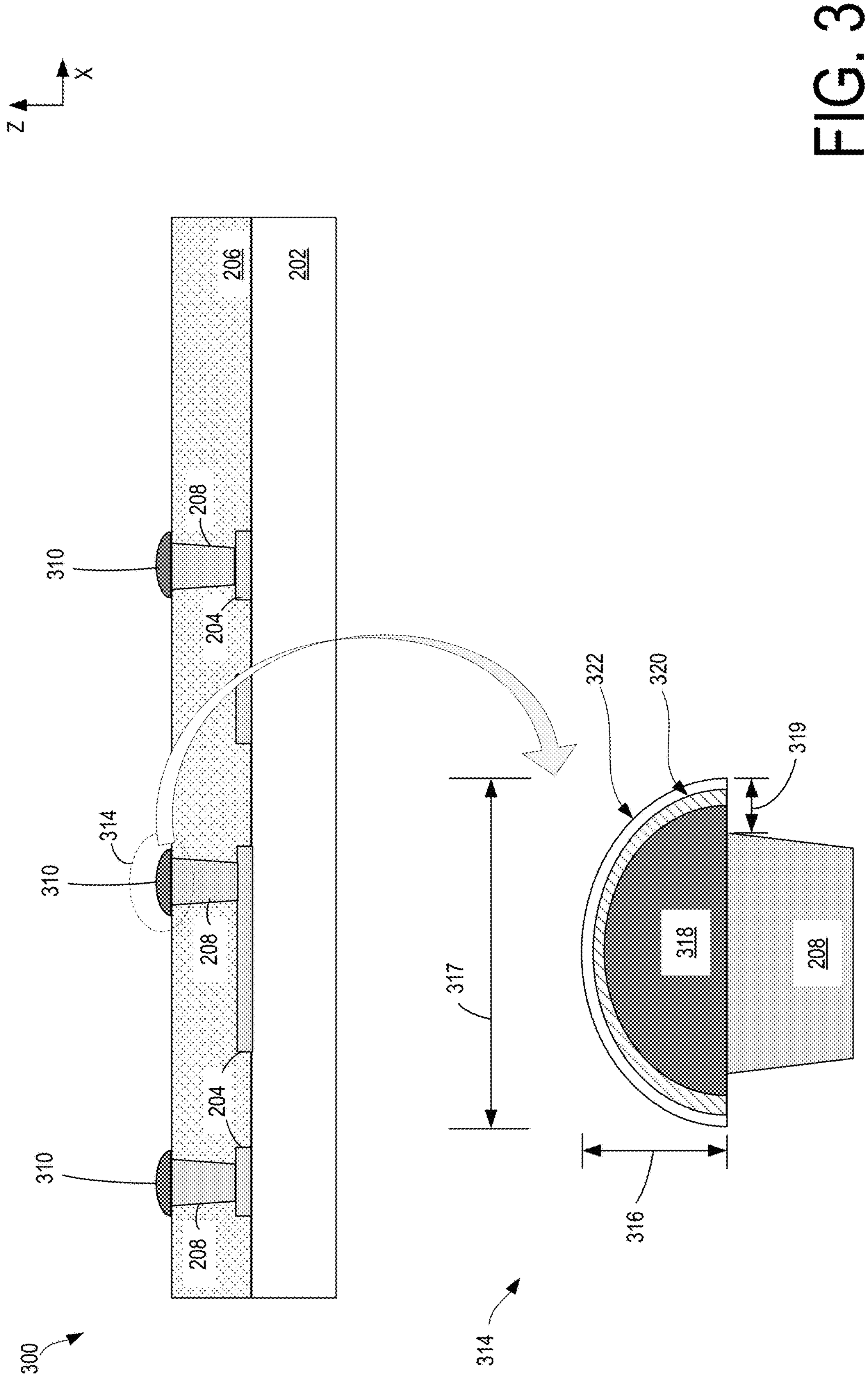

Embodiments of a substrate package or substrate patch include at least one build-up dielectric layer 202, as illustrated in FIG. 2. Embodiment 200 illustrates (at 902) fabrication of a build-up (or "first") dielectric layer 202 patterned with a conductive layer 204. The dielectric layer 202 can be a suitable epoxy-based organic dielectric.

The conductive layer 204 comprises traces and pads and may be referred to as either a "surface metal" layer or a "final" metal layer. The conductive layer 204 may comprise a metal (e.g., copper, aluminum, nickel, cobalt, iron, tin, gold, silver, or combinations thereof) or another suitable conductive material, and provide electrically conductive paths from an origin to a terminus of the respective trace. The conductive layer 204 may comprise a thickness in a range of about 1 micron to about 30 microns. In an embodiment, the conductive layer 204 has a thickness of about 15 microns.

At 904, conductive vias/pillars 208 may be fabricated on some locations of the conductive layer (surface metal) 204. The vias/pillars 208 also comprise a conductive material or metal, and in various embodiments the vias 208 are substantially perpendicular to an upper surface of the dielectric layer 202.

At 906, the upper surface of the substrate is laminated (indicated with embodiment 250, adding a dielectric layer generally referred to as a solder resist layer 206) which is then planarized to expose (indicated by arrows 212) either the vias 208 or the conductive layer 204 (i.e., the metal traces and contacts). The planarization at 906 results in a flat, planar, surface finish, achieved via a planarization or etch-back process. The surface finish is referred to as flat, or planar, as defined above and can be confirmed with a scanning electron microscope SEM/TEM image (exhibiting less than a +/−5 micron variation, for either a protrusion above the surface or a recess in the surface; see, e.g., FIG. 7 and accompanying description for further discussion of the planarity). This surface finish for the substrate package enables the use of an electroless NiPdAu process, as illustrated in the following discussion.

At 908, ENEPIG deposition is performed on the planarized substrate surface. Responsive thereto, one or more "conductive domes," which are electroless NiPdAu deposits 310 are located on exposed conductive layer 204 or exposed vias 208. In an embodiment, the ENEPIG deposition is selective to exposed copper on the upper surface. The NiPdAu deposits 310 bond to the vias 208 and create an electrical pathway with the copper or other conductive material making up the vias 208. As shown in embodiment 300 (and enlarged as deposit 314) respective conductive domes or NiPdAu deposits have a cross-sectional area in the X-Z plane in the figure that is something like a half of a circle, and, when attached to the pillar 208, looks like a mushroom head. An outer diameter 317 of the NiPdAu deposits appear as a width in the X-Z view, including a radial extension 319, located external to the periphery of the pillar or via 208. In an embodiment, the radial extension 319 may be from about 5 microns to about 10 microns.

Further describing this "conductive dome" or "mushroom head:" a radius of the conductive dome is larger than a radius of the pillar or via 208 by radial extension 319. Although the radial extension 319 is depicted on two sides (left and right in the X-Z plane shown in the figure), one with skill in the art will appreciate that the radial extension is an extension to the radius of the via 208 in three dimensions, and therefore extends away from/external to a periphery of the pillar 208 in 360 degrees. When viewed in a top down or X-Y plane, the conductive dome would appear substantially circular, and in three dimensions, the conductive dome would appear as substantially half of a sphere, attached on its flat surface to the pillar or via 208.

This conductive dome or "mushroom head" structure can be confirmed with a SEM/TEM image inspection, in which the conductive dome or NiPdAu deposit 314 can be viewed as larger in diameter than a respective via/pillar 208. Moreover, the NiPdAu deposit 314 comprises a core 318 of nickel, overlayed with a layer of palladium 320, which is overlayed with a layer of gold 322, as illustrated. A height 316 of the conductive dome or NiPdAu deposit 314 may be about 7 microns.

Figure 4:
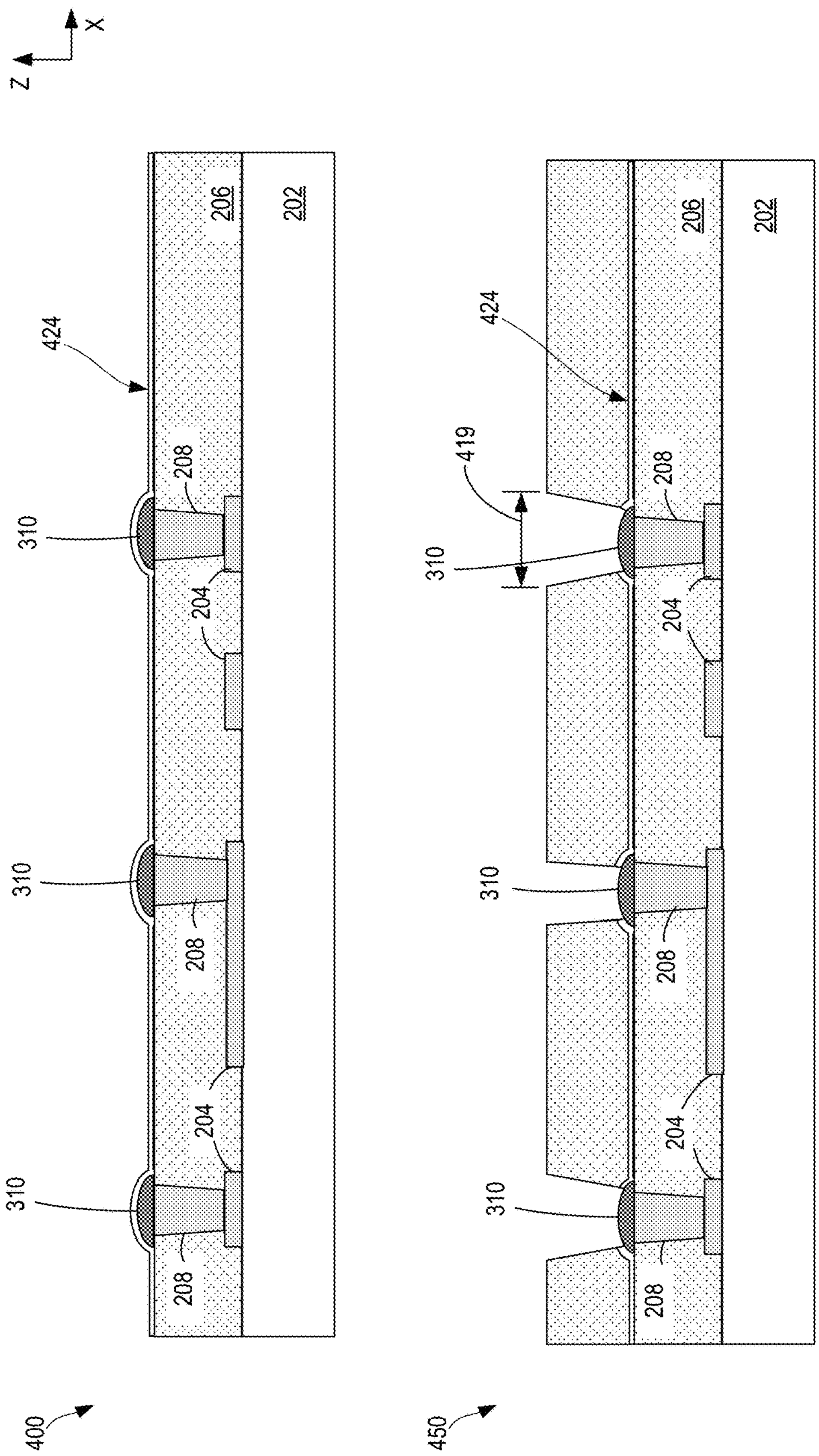

Moving to FIG. 4, embodiment 400 depicts embodiment 300 overlayed (at 910) with an optional adhesion layer 424. In a non-limiting example, the adhesion layer may comprise silicon nitride (SiNx). When the adhesion layer is employed, it initially overlays the entire surface, including any respective NiPdAu deposits 310.

At 912, (optionally) a final solder resist deposition and lithography process may be performed. The material of the final solder resist layer 452 may be indistinguishable from the solder resist layer 206, therefore the pattern used for each is the same in the figures. Note, in embodiment 450, that the walls of the openings etched in the solder resist layer 452 are tapered, with an opening 419 that is larger at an upper surface, tapering to a smaller diameter than the outer diameter 317, where it is substantially centered on respective NiPdAu deposits 310. In an example, the solder resist opening 419 is about 50 microns in diameter and about 20 microns deep. In other embodiments, the solder resist opening 419 has different dimensions. Also at 912, any adhesion layer 424 that was present on the NiPdAu deposits 310 is removed. A plasma etch may be implemented for removal of the adhesion layer (e.g., for nitride removal).

Figure 5:
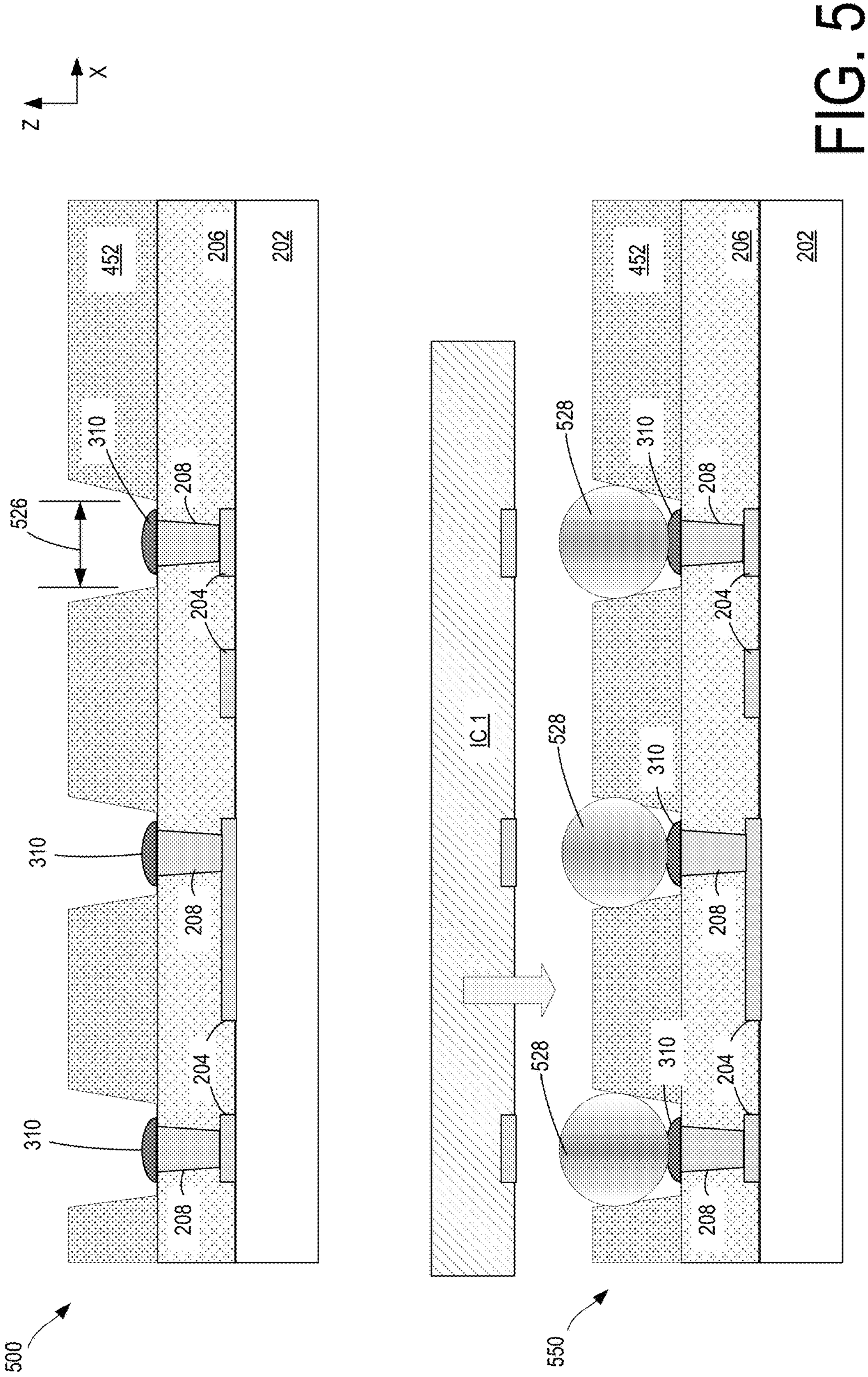
Figure 6:
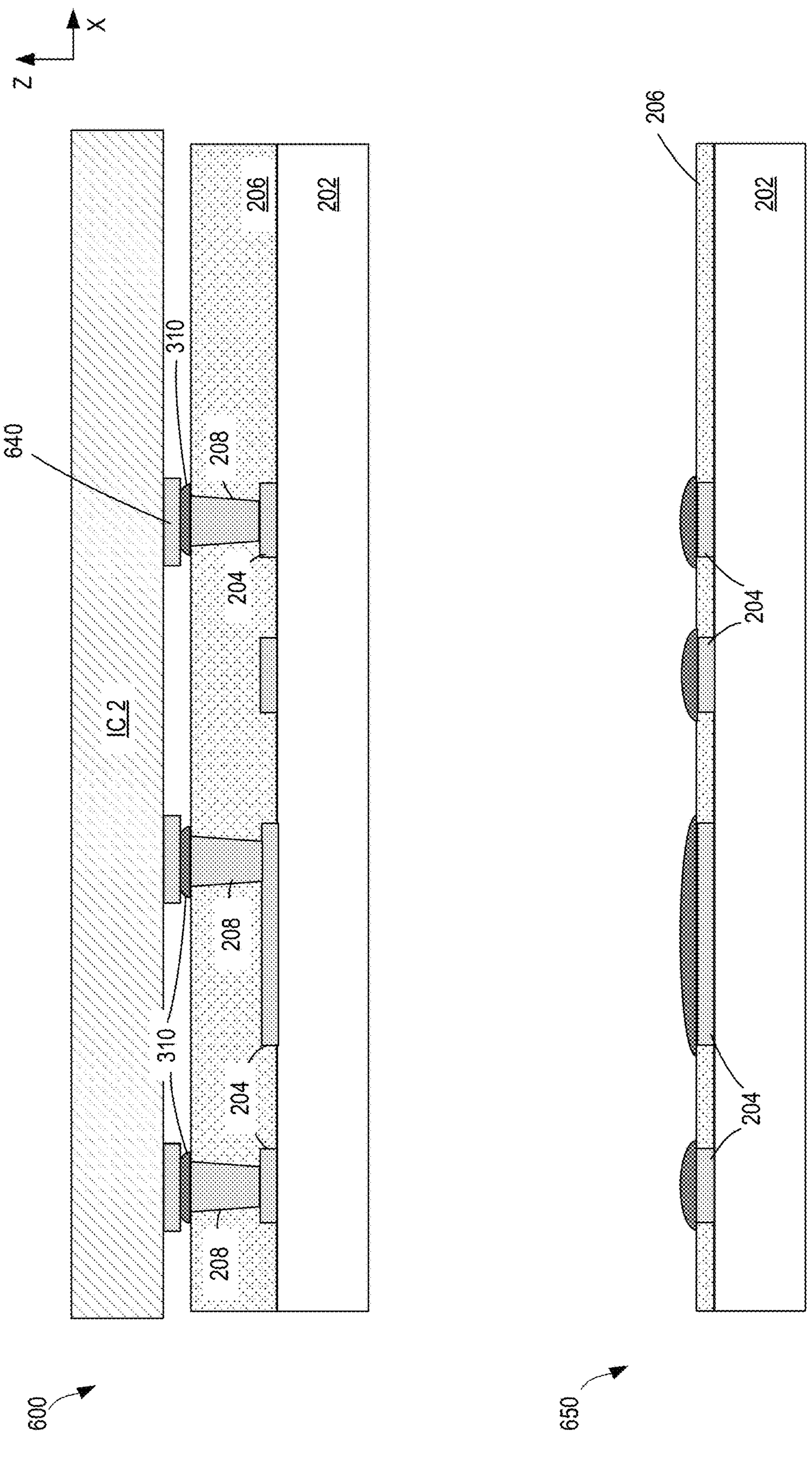

In another embodiment 500, shown in FIG. 5, the walls of the openings etched in the solder resist layer 452 are tapered, with an opening that is larger at an upper surface, tapering to a smaller diameter where it is substantially centered on respective NiPdAu deposits 310, however in this embodiment, the diameter 526 of the opening is larger than the outer diameter 317, meaning in practice that the openings exceed the periphery of the NiPdAu deposit.

As those with skill in the art will appreciate, the tasks described above can also be performed on the backside of a substrate, as generally indicated at 914.

As shown in embodiment 550, at 916, solder material 528 may be placed or deposited in/adjacent to the openings in the solder resist; i.e., in the openings associated with respective NiPdAu deposits 310, in anticipation of attaching (as indicated with the arrow) an integrated circuit die (IC 1) to the solder material 528. In various embodiments, the solder material 528 for solder bumps used to attach die IC 1 and die IC 2 may be a solder alloy such as tin and gold, or the like. Embodiment 550, when further including a glass layer 890, as described in connection with FIG. 8, may be a standalone substrate/substrate package or have an IC die (e.g., IC 1) attached.

In another variation, as illustrated with embodiment 600, an IC die (IC 2) that already has liquid metal or solder 640 attached to its die-side contacts may be intended for the substrate package. In these embodiments, the optional final solder resist 452 and solder material 528 may be omitted; instead, the IC 2 may be attached directly to the NiPdAu deposits 310.

In yet another embodiment 650, the conductive layer 204 (metal traces and contacts) may be directly coated with the ENEPIG, as illustrated. This variation may be desirable for cost sensitive applications, as it omits the cost of the via/pillar 208 fabrication and plating (sometimes called "pillar on pad" flow). Instead, to obtain the flat, planar, surface described above, the first dielectric layer or solder resist 206 is planarized with a reveal or back etch to open up the contacts in the full surface metal layer (conductive layer 204). This variation may be constrained to lower frequencies, because nickel (Ni) is magnetic and can be problematic for high frequency applications.

Figure 7:
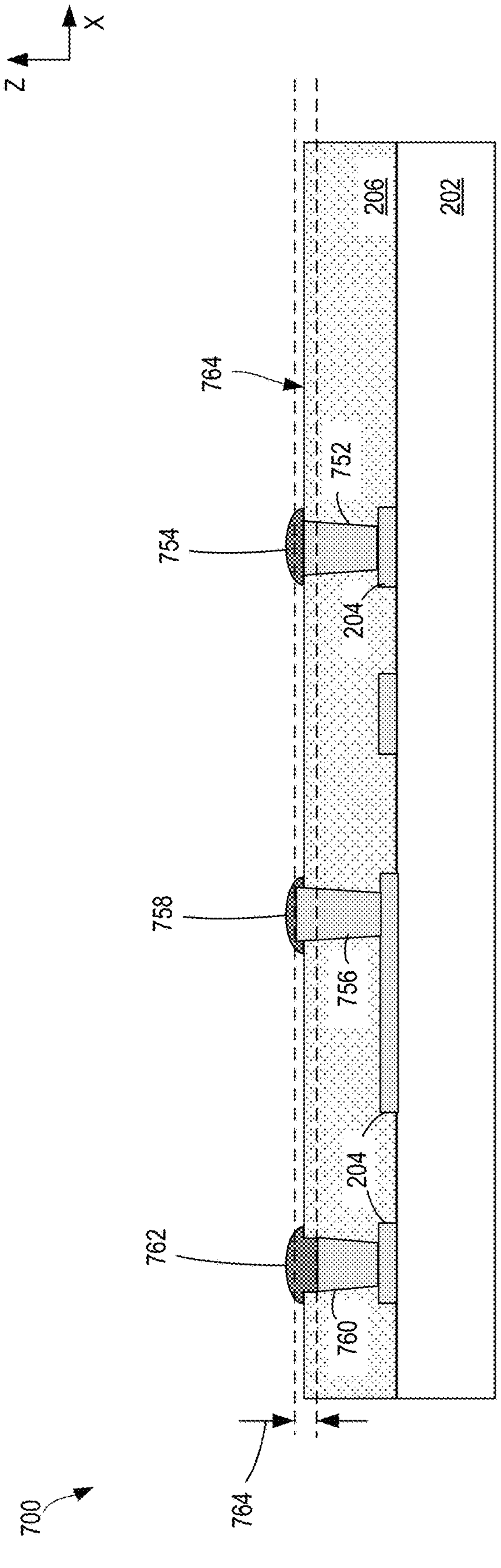

In FIG. 7, the planarized surface of the solder resist 206 or first dielectric layer is further illustrated. As mentioned above, the flatness or surface planarity means in a range of plus 5 microns to minus 5 microns (indicated by the dashed lines 764). From right to left, a first example shows the top of the pillar 752 being substantially coplanar with the surface 764 and having a half-dome shaped NiPdAu deposit 754 attached thereto. The top of pillar 756 protrudes less than 5 microns above surface 764 and has NiPdAu deposit 758 attached thereto. The top of pillar 760 is below the surface 764, causing a recess in the surface 764, the recess being less than 5 microns deep. Pillar 760 has NiPdAu deposit 762 attached thereto. The examples in FIG. 7 each provide a sufficient electrical connection between the respective pillar and NiPdAu deposit without having been subjected to the aforementioned shock and sway process.

At 918, embodiments may be subjected to further substrate fabrication, including additional redistribution layers (RDL, referred to as conductive layers 204 herein), additional dielectric or build-up layers, a variety of solder bump or solder attach techniques, or the like.

The apparatus and methods described in connection with FIGS. 2-7 can be implemented in substrate packages that use a glass core. The embodiment 800 of FIG. 8 is a simplified illustration of a semiconductor package with a glass core 890 that is fabricated using the apparatus and methods described above. In embodiment 800, a plurality of solder resist or dielectric layers 886 are built up and have redistribution layers therein. The conductive traces or surface metal layer 204 described above is indicated, as are the vias 208. The upper surface 882 is a planarized surface, as described herein, having thereon an electroless NiPdAu deposit, also as described above. The attachment method on the upper surface for IC 1 and IC 2 reflects the embodiment described in connection with FIG. 6, although the same can be illustrated for the embodiments in FIG. 5. The glass core 890 has one or more through-glass-vias 888, and dielectric layers 892 on a lower side or back side of the glass core 890. The backside surface 898 has also been planarized as described above and had electroless NiPdAu deposits located on the pillars or vias on the backside, as shown. The backside could be further soldered or attached to another die or substrate or printed circuit board.

The glass core 890 may comprise glass, (as used herein, glass can be an alkali-free alkaline earth boro-aluminosilicate glass, such as a glass comprising aluminum, oxygen, boron, silicon, and an alkaline-earth metal (e.g., beryllium, magnesium, calcium, strontium, barium, radium, such as a glass comprising $SiO_2$, $Al_2O_3$, $B_2O_3$, and MgO), or a photosensitive glass (photomachineable or photostructurable glass). In some embodiments, a photosensitive glass can be a glass that belongs to the lithium-silicate family of glass (e.g., a glass comprising lithium, silicon, and oxygen) comprising metallic particles, such as gold, silver, or other suitable metallic particles. Glass core 890 may comprise multiple glass sheets bonded together with an adhesion layer. In various embodiments, the glass core 890 may have a thickness in a range of about 20 microns to about 1 millimeter, +/−10%.

The glass core 890 may be an all-glass core. Additionally, the glass "core" may be a combination of glass and epoxy. Accordingly, in various embodiments, an epoxy layer (not shown) may be located adjacent to the glass core 890 and between the glass core 890 and the dielectric layers 886. The epoxy layer may include epoxy resin, a fiberglass-reinforced epoxy resin, an epoxy resin with inorganic fillers, a ceramic material, or a polymer material such as polyimide.

Dielectric layers were introduced above, in connection with dielectric layer 202. Further, in various embodiments, the dielectric layers 886 and 892 can include, overlaid on one or more conductive layers (204), a dielectric material, such as, an epoxy based organic material. In other embodiments, a suitable nitride or oxide, such as silicon dioxide ($SiO_2$), carbon-doped silicon dioxide (C-doped $SiO_2$, also known as CDO or organosilicate glass, which is a material that comprises silicon, oxygen, and carbon), fluorine-doped silicon dioxide (F-doped $SiO_2$, also known as fluorosilicate glass, which is a material that comprises fluorine, silicon, and oxygen), hydrogen-doped silicon dioxide (H-doped $SiO_2$, which is a material that comprises silicon, oxygen, and hydrogen). In some embodiments, a dielectric layer comprises a photo-imagable dielectric (PID). In some embodiments, the dielectric layer comprises an organic resin matrix with different types of fillers (for example, silica fillers of different sizes, or hollow fillers of different sizes) to control the coefficient of thermal expansion (CTE) and/or electrical properties (e.g., the dielectric constant (Dk), and/or dissipation factor (insertion loss) (Df)).

In some embodiments, it is advantageous for the dielectric layer 886 to have a CTE that matches that of target integrated circuit or PIC dies (e.g., IC 1, IC 2, and/or match the CTE of silicon) attached to a substrate or PCB. In some embodiments, the dielectric material can have a CTE that is close (e.g., within 10%) to that of silicon. In other embodiments, the dielectric material can be any type of epoxy molding compound.

Thus, various non-limiting embodiments of apparatus and methods for electroless surface finishing on substrates with glass have been described. The disclosed embodiments use a planarization process, an etch-back process, or any via reveal method to create a flatter, more planar, upper substrate surface. Planarity is characterized by having surface variations of less than about 5 microns, as measured by recesses and/or protrusions. The planar surface enables using substrate with glass cores and finishing the substrate surface with an electroless NiPdAu process. The following description provides additional detail and context for various die and various package assembly and device configurations that can be created based on or using the provided embodiments.

Figure 10:
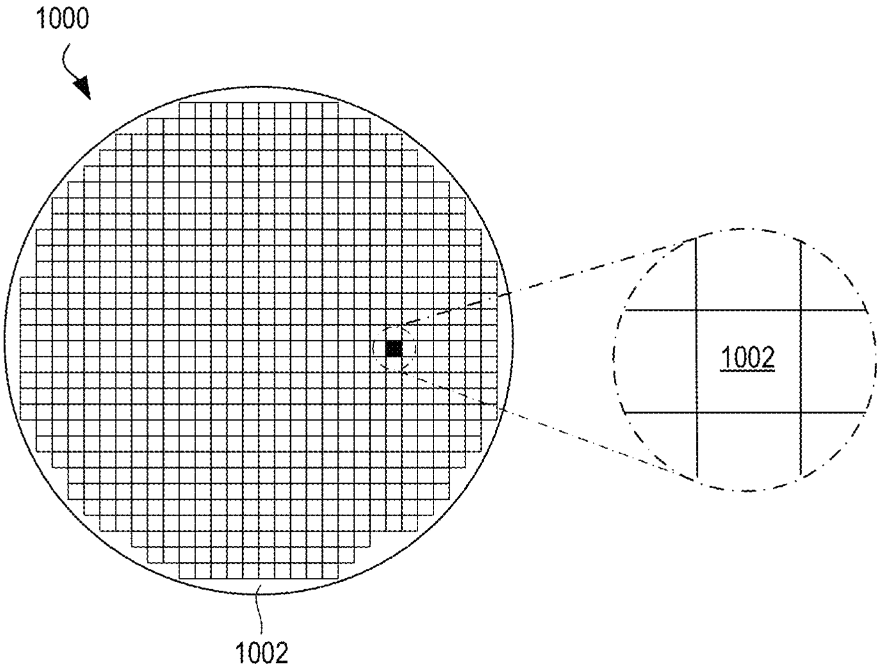
FIG. 10 is a top view of a wafer and dies that may be included in a microelectronic assembly, in accordance with any of the embodiments disclosed herein.

FIG. 10 is a top view of a wafer 1000 and dies 1002 that may be included in any of the embodiments disclosed herein. The wafer 1000 may be composed of semiconductor material and may include one or more dies 1002 formed on a surface of the wafer 1000. After the fabrication of the integrated circuit components on the wafer 1000 is complete, the wafer 1000 may undergo a singulation process in which the dies 1002 are separated from one another to provide discrete "chips" or destined for a packaged integrated circuit component. The individual dies 1002, comprising an integrated circuit component, may include one or more transistors (e.g., some of the transistors 1140 of FIG. 11, discussed below), supporting circuitry to route electrical signals to the transistors, passive components (e.g., signal traces, resistors, capacitors, or inductors), and/or any other integrated circuit components. In some embodiments, the wafer 1000 or the die 1002 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Additionally, multiple devices may be combined on a single die 1002. For example, a memory array formed by multiple memory devices may be formed on a same die 1002 as a processor unit (e.g., the processor unit 1302 of FIG. 13) or other logic that is configured to store information in the memory devices or execute instructions stored in the memory array. In some embodiments, a die 1002 may be attached to a wafer 1000 that includes other die, and the wafer 1000 is subsequently singulated, this manufacturing procedure is referred to as a die-to-wafer assembly technique.

Figure 11:
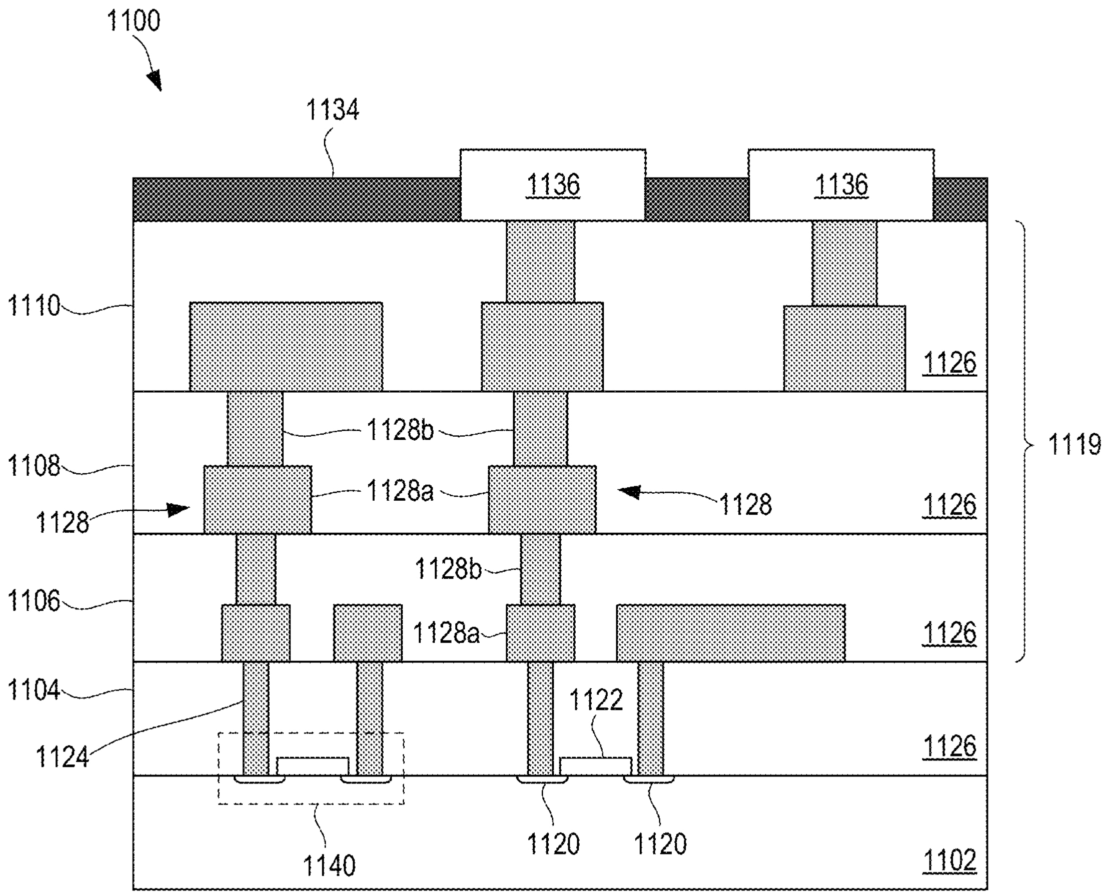
FIG. 11 is a simplified cross-sectional side view showing an implementation of an integrated circuit on a die that may be included in various embodiments, in accordance with any of the embodiments disclosed herein.

FIG. 11 is a cross-sectional side view of an integrated circuit 1100 that may be included in any of the embodiments disclosed herein. One or more of the integrated circuits 1100 may be included in one or more dies 1002 (FIG. 10). The integrated circuit 1100 may be formed on a die substrate 1102 (e.g., the wafer 1000 of FIG. 10) and may be included in a die (e.g., the die 1002 of FIG. 10).

The die substrate 1102 may be a semiconductor substrate composed of semiconductor material systems including, for example, n-type or p-type materials systems (or a combination of both). The die substrate 1102 may include, for example, a crystalline substrate formed using a bulk silicon or a silicon-on-insulator (SOI) substructure. In some embodiments, the die substrate 1102 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1102. Although a few examples of materials from which the die substrate 1102 may be formed are described here, any material that may serve as a foundation for an integrated circuit 1100 may be used. The die substrate 1102 may be part of a singulated die (e.g., the dies 1002 of FIG. 10) or a wafer (e.g., the wafer 1000 of FIG. 10).

The integrated circuit 1100 may include one or more device layers 1104 disposed on the die substrate 1102. The device layer 1104 may include features of one or more transistors 1140 (e.g., metal oxide semiconductor field-effect transistors (MOSFETs)) formed on the die substrate 1102. The transistors 1140 may include, for example, one or more source and/or drain (S/D) regions 1120, a gate 1122 to control current flow between the S/D regions 1120, and one or more S/D contacts 1124 to route electrical signals to/from the S/D regions 1120.

The gate 1122 may be formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be conducted on the gate dielectric to improve its quality when a high-k material is used.

The gate electrode may be formed on the gate dielectric and may include at least one p-type work function metal or n-type work function metal, depending on whether the transistor 1140 is to be a p-type metal oxide semiconductor (PMOS) or an n-type metal oxide semiconductor (NMOS) transistor. In some implementations, the gate electrode may comprise a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1140 along the source-channel-drain direction, the gate electrode may comprise a U-shaped structure that includes a bottom portion substantially parallel to the surface of the die substrate 1102 and two sidewall portions that are substantially perpendicular to the top surface of the die substrate 1102. In other embodiments, at least one of the metal layers that form the gate electrode may simply be a planar layer that is substantially parallel to the top surface of the die substrate 1102 and does not include sidewall portions substantially perpendicular to the top surface of the die substrate 1102. In other embodiments, the gate electrode may comprise a combination of U-shaped structures and planar, non-U-shaped structures. For example, the gate electrode may comprise one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and include deposition and etching processes. In some embodiments, a plurality of spacer pairs may be used; for instance, two pairs, three pairs, or four pairs of sidewall spacers may be formed on opposing sides of the gate stack.

The S/D regions 1120 may be formed within the die substrate 1102 adjacent to the gate 1122 of individual transistors 1140. The S/D regions 1120 may be formed using an implantation/diffusion process or an etching/deposition process, for example. In the former process, dopants such as boron, aluminum, antimony, phosphorous, or arsenic may be ion-implanted into the die substrate 1102 to form the S/D regions 1120. An annealing process that activates the dopants and causes them to diffuse farther into the die substrate 1102 may follow the ion-implantation process. In the latter process, the die substrate 1102 may first be etched to form recesses at the locations of the S/D regions 1120. An epitaxial deposition process may then be conducted to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or input/output (I/O) signals, may be routed to and/or from the devices (e.g., transistors 1140) of the device layer 1104 through one or more interconnect layers disposed on the device layer 1104 (illustrated in FIG. 11 as interconnect layers 1106-1110). For example, electrically conductive features of the device layer 1104 (e.g., the gate 1122 and the S/D contacts 1124) may be electrically coupled with the interconnect structures 1128 of the interconnect layers 1106-1110. The one or more interconnect layers 1106-1110 may form a metallization stack (also referred to as an "ILD stack") 1119 of the integrated circuit 1100.

The interconnect structures 1128 may be arranged within the interconnect layers 1106-1110 to route electrical signals according to a wide variety of designs; in particular, the arrangement is not limited to the particular configuration of interconnect structures 1128 depicted in FIG. 11. Although a particular number of interconnect layers 1106-1110 is depicted in FIG. 11, embodiments of the present disclosure include integrated circuits having more or fewer interconnect layers than depicted.

In some embodiments, the interconnect structures 1128 may include lines 1128*a* and/or vias 1128*b* filled with an electrically conductive material such as a metal. The lines 1128*a* may be arranged to route electrical signals in a direction of a plane that is substantially parallel with a surface of the die substrate 1102 upon which the device layer 1104 is formed. For example, the lines 1128*a* may route electrical signals in a direction in and out of the page and/or in a direction across the page. The vias 1128*b* may be arranged to route electrical signals in a direction of a plane that is substantially perpendicular to the surface of the die substrate 1102 upon which the device layer 1104 is formed. In some embodiments, the vias 1128*b* may electrically couple lines 1128*a* of different interconnect layers 1106-1110 together.

The interconnect layers 1106-1110 may include a dielectric material 1126 disposed between the interconnect structures 1128, as shown in FIG. 11. In some embodiments, dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same. The device layer 1104 may include a dielectric material 1126 disposed between the transistors 1140 and a bottom layer of the metallization stack as well. The dielectric material 1126 included in the device layer 1104 may have a different composition than the dielectric material 1126 included in the interconnect layers 1106-1110; in other embodiments, the composition of the dielectric material 1126 in the device layer 1104 may be the same as a dielectric material 1126 included in any one of the interconnect layers 1106-1110.

A first interconnect layer 1106 (referred to as Metal 1 or "M1") may be formed directly on the device layer 1104. In some embodiments, the first interconnect layer 1106 may include lines 1128*a* and/or vias 1128*b*, as shown. The lines 1128*a* of the first interconnect layer 1106 may be coupled with contacts (e.g., the S/D contacts 1124) of the device layer 1104. The vias 1128*b* of the first interconnect layer 1106 may be coupled with the lines 1128*a* of a second interconnect layer 1108.

The second interconnect layer 1108 (referred to as Metal 2 or "M2") may be formed directly on the first interconnect layer 1106. In some embodiments, the second interconnect layer 1108 may include via 1128*b* to couple the lines 1128 of the second interconnect layer 1108 with the lines 1128*a* of a third interconnect layer 1110. Although the lines 1128*a* and the vias 1128*b* are structurally delineated with a line within individual interconnect layers for the sake of clarity, the lines 1128*a* and the vias 1128*b* may be structurally and/or materially contiguous (e.g., simultaneously filled during a dual-damascene process) in some embodiments.

The third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106. In some embodiments, the interconnect layers that are "higher up" in the metallization stack 1119 in the integrated circuit 1100 (i.e., farther away from the device layer 1104) may be thicker than the interconnect layers that are lower in the metallization stack 1119, with lines 1128*a* and vias 1128*b* in the higher interconnect layers being thicker than those in the lower interconnect layers.

The integrated circuit 1100 may include a solder resist material 1134 (e.g., polyimide or similar material) and one or more conductive contacts 1136 formed on the interconnect layers 1106-1110. In FIG. 11, the conductive contacts 1136 are illustrated as taking the form of bond pads. The conductive contacts 1136 may be electrically coupled with the interconnect structures 1128 and configured to route the electrical signals of the transistor(s) 1140 to external devices. For example, solder bonds may be formed on the one or more conductive contacts 1136 to mechanically and/or electrically couple an integrated circuit die including the integrated circuit 1100 with another component (e.g., a printed circuit board). The integrated circuit 1100 may include additional or alternate structures to route the electrical signals from the interconnect layers 1106-1110; for example, the conductive contacts 1136 may include other analogous features (e.g., posts) that route the electrical signals to external components.

In some embodiments in which the integrated circuit 1100 is a double-sided die, the integrated circuit 1100 may include another metallization stack (not shown) on the opposite side of the device layer(s) 1104. This metallization stack may include multiple interconnect layers as discussed above with reference to the interconnect layers 1106-1110, to provide electrically conductive paths (e.g., including conductive lines and vias) between the device layer(s) 1104 and additional conductive contacts (not shown) on the opposite side of the integrated circuit 1100 from the conductive contacts 1136.

In other embodiments in which the integrated circuit 1100 is a double-sided die, the integrated circuit 1100 may include one or more through-silicon vias (TSVs) through the die substrate 1102; these TSVs may make contact with the device layer(s) 1104, and may provide electrically conductive paths between the device layer(s) 1104 and additional conductive contacts (not shown) on the opposite side of the integrated circuit 1100 from the conductive contacts 1136. In some embodiments, TSVs extending through the substrate can be used for routing power and ground signals from conductive contacts on the opposite side of the integrated circuit 1100 from the conductive contacts 1136 to the transistors 1140 and any other components integrated into the die 1100, and the metallization stack 1119 can be used to route I/O signals from the conductive contacts 1136 to transistors 1140 and any other components integrated into the die 1100.

Multiple integrated circuits 1100 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 12:
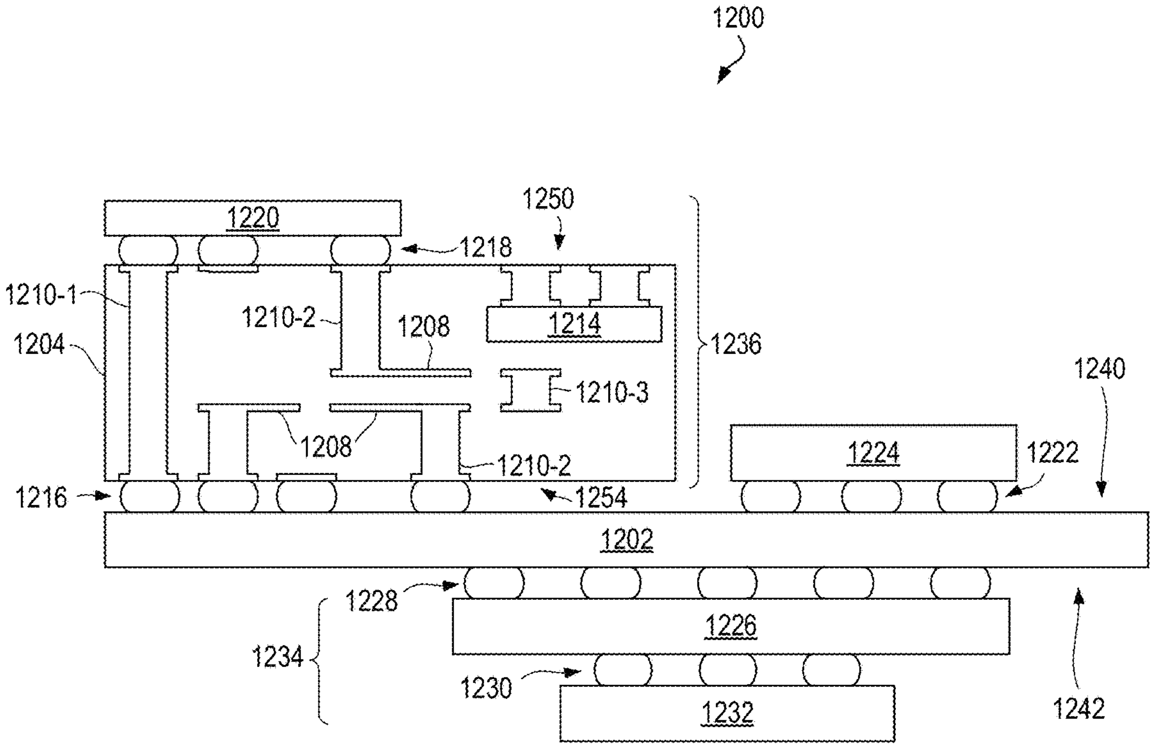
FIG. 12 is a cross-sectional side view of a microelectronic assembly that may include any of the embodiments disclosed herein.

FIG. 12 is a cross-sectional side view of a microelectronic assembly 1200 that may include any of the embodiments disclosed herein. The microelectronic assembly 1200 includes multiple integrated circuit components disposed on a circuit board 1202 (which may be a motherboard, system board, mainboard, etc.). The microelectronic assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1202. In other embodiments, the circuit board 1202 may be a non-PCB substrate. The microelectronic assembly 1200 illustrated in FIG. 12 includes a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 12), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1236 may include an integrated circuit component 1220 coupled to an interposer 1204 by coupling components 1218. The coupling components 1218 may take any suitable form for the application, such as the forms discussed above with reference to the coupling components 1216. Although a single integrated circuit component 1220 is shown in FIG. 12, multiple integrated circuit components may be coupled to the interposer 1204; indeed, additional interposers may be coupled to the interposer 1204. The interposer 1204 may provide an intervening substrate used to bridge the circuit board 1202 and the integrated circuit component 1220.

The integrated circuit component 1220 may be a packaged or unpackaged integrated circuit component that includes one or more integrated circuit dies (e.g., the die 1002 of FIG. 10, the integrated circuit 1100 of FIG. 11) and/or one or more other suitable components.

The unpackaged integrated circuit component 1220 comprises solder bumps attached to contacts on the die. The solder bumps allow the die to be directly attached to the interposer 1204. In embodiments where the integrated circuit component 1220 comprises multiple integrated circuit die, the dies can be of the same type (a homogeneous multi-die integrated circuit component) or of two or more different types (a heterogeneous multi-die integrated circuit component). In addition to comprising one or more processor units, the integrated circuit component 1220 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate, or combinations thereof. A packaged multi-die integrated circuit component can be referred to as a multi-chip package (MCP) or multi-chip module (MCM).

The interposer 1204 may spread connections to a wider pitch or reroute a connection to a different connection. For example, the interposer 1204 may couple the integrated circuit component 1220 to a set of ball grid array (BGA) conductive contacts of the coupling components 1216 for coupling to the circuit board 1202. In the embodiment illustrated in FIG. 12, the integrated circuit component 1220 and the circuit board 1202 are attached to opposing sides of the interposer 1204; in other embodiments, the integrated circuit component 1220 and the circuit board 1202 may be attached to a same side of the interposer 1204. In some embodiments, three or more components may be interconnected by way of the interposer 1204.

In some embodiments, the interposer 1204 may be formed as a PCB, including multiple metal layers separated from one another by layers of dielectric material and interconnected by electrically conductive vias. In some embodiments, the interposer 1204 may be formed of an epoxy resin, a fiberglass-reinforced epoxy resin, an epoxy resin with inorganic fillers, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through hole vias 1210-1 (that extend from a first face 1250 of the interposer 1204 to a second face 1254 of the interposer 1204), blind vias 1210-2 (that extend from the first or second faces 1250 or 1254 of the interposer 1204 to an internal metal layer), and buried vias 1210-3 (that connect internal metal layers).

In some embodiments, the interposer 1204 can comprise a silicon interposer. Through-silicon vias (TSV) extending through the silicon interposer can connect connections on a first face of a silicon interposer to an opposing second face of the silicon interposer. In some embodiments, an interposer 1204 comprising a silicon interposer can further comprise one or more routing layers to route connections on a first face of the interposer 1204 to an opposing second face of the interposer 1204.

The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The integrated circuit assembly 1200 may include an integrated circuit component 1224 coupled to the first face 1240 of the circuit board 1202 by coupling components 1222. The coupling components 1222 may take the form of any of the embodiments discussed above with reference to the coupling components 1216, and the integrated circuit component 1224 may take the form of any of the embodiments discussed above with reference to the integrated circuit component 1220.

The integrated circuit assembly 1200 illustrated in FIG. 12 includes a package-on-package structure 1234 coupled to the second face 1242 of the circuit board 1202 by coupling components 1228. The package-on-package structure 1234 may include an integrated circuit component 1226 and an integrated circuit component 1232 coupled together by coupling components 1230 such that the integrated circuit component 1226 is disposed between the circuit board 1202 and the integrated circuit component 1232. The coupling components 1228 and 1230 may take the form of any of the embodiments of the coupling components 1216 discussed above, and the integrated circuit components 1226 and 1232 may take the form of any of the embodiments of the integrated circuit component 1220 discussed above. The package-on-package structure 1234 may be configured in accordance with any of the package-on-package structures known in the art.

Figure 13:
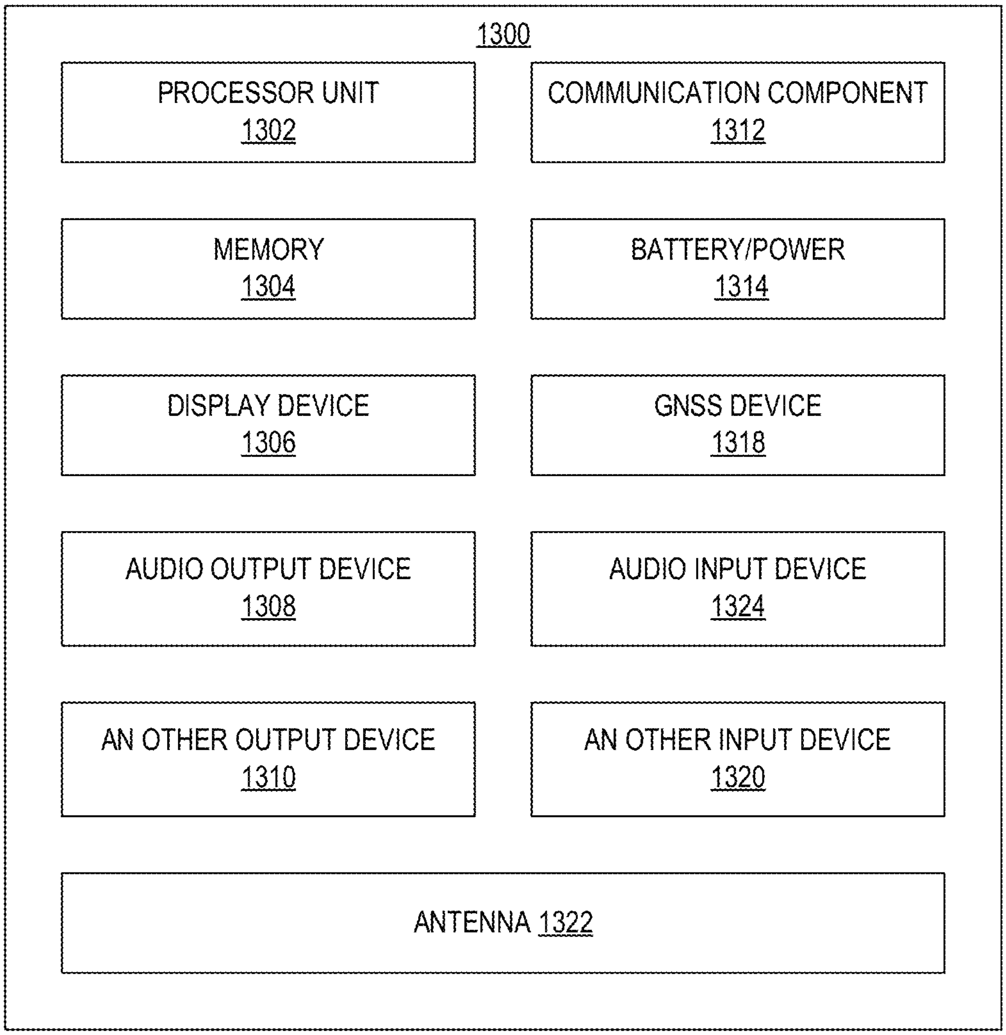
FIG. 13 is a block diagram of an example electrical device that may include any of the embodiments disclosed herein.

FIG. 13 is a block diagram of an example electrical device 1300 that may include one or more of the embodiments disclosed herein. For example, any suitable ones of the components of the electrical device 1300 may include one or more of the microelectronic assemblies 1200, integrated circuit components 1220, integrated circuits 1100, integrated circuit dies 1002, or structures disclosed herein. A number of components are illustrated in FIG. 13 as included in the electrical device 1300, but any one or more of these components may be omitted or duplicated, as suitable for the application. In some embodiments, some or all the components included in the electrical device 1300 may be attached to one or more motherboards, mainboards, printed circuit boards, or system boards. In some embodiments, one or more of these components are fabricated onto a single system-on-a-chip (SoC) die. In various embodiments, the electrical device 1300 is enclosed by, or integrated with, a housing.

Additionally, in various embodiments, the electrical device 1300 may not include one or more of the components illustrated in FIG. 13, but the electrical device 1300 may include interface circuitry for coupling to the one or more components. For example, the electrical device 1300 may not include a display device 1306, but may include display device interface circuitry (e.g., a connector and driver circuitry) to which a display device 1306 may be coupled. In another set of examples, the electrical device 1300 may not include an audio input device 1324 or an audio output device 1308, but may include audio input or output device interface circuitry (e.g., connectors and supporting circuitry) to which an audio input device 1324 or audio output device 1308 may be coupled.

The electrical device 1300 may include one or more processor units 1302 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1302 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller crypto processors (specialized processors that execute cryptographic algorithms within hardware), server processors, controllers, or any other suitable type of processor units. As such, the processor unit can be referred to as an XPU (or xPU).

The electrical device 1300 may include a memory 1304, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1304 may include memory that is located on the same integrated circuit die as the processor unit 1302. This memory may be used as cache memory (e.g., Level 1 (L1), Level 2 (L2), Level 3 (L3), Level 4 (L4), Last Level Cache (LLC)) and may include embedded dynamic random-access memory (eDRAM) or spin transfer torque magnetic random-access memory (STT-MRAM).

In some embodiments, the electrical device 1300 can comprise one or more processor units 1302 that are heterogeneous or asymmetric to another processor unit 1302 in the electrical device 1300. There can be a variety of differences between the processor units 1302 in a system in terms of a spectrum of metrics of merit including architectural, microarchitectural, thermal, power consumption characteristics, and the like. These differences can effectively manifest themselves as asymmetry and heterogeneity among the processor units 1302 in the electrical device 1300.

In some embodiments, the electrical device 1300 may include a communication component 1312 (e.g., one or more communication components). For example, the communication component 1312 can manage wireless communications for the transfer of data to and from the electrical device 1300. The term "wireless" and its derivatives may be used to describe circuits, devices, systems, methods, techniques, communications channels, etc., that may communicate data using modulated electromagnetic radiation through a nonsolid medium. The term "wireless" does not imply that the associated devices do not contain any wires, although in some embodiments they might not.

The communication component 1312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1312 may operate in accordance with other wireless protocols in other embodiments. The electrical device 1300 may include an antenna 1322 to facilitate wireless communications and/or to receive other wireless communications (such as AM or FM radio transmissions).

In some embodiments, the communication component 1312 may manage wired communications, such as electrical, optical, or any other suitable communication protocols (e.g., IEEE 802.3 Ethernet standards). As noted above, the communication component 1312 may include multiple communication components. For instance, a first communication component 1312 may be dedicated to shorter-range wireless communications such as Wi-Fi or Bluetooth, and a second communication component 1312 may be dedicated to longer-range wireless communications such as global positioning system (GPS), EDGE, GPRS, CDMA, WiMAX, LTE, EV-DO, or others. In some embodiments, a first communication component 1312 may be dedicated to wireless communications, and a second communication component 1312 may be dedicated to wired communications.

The electrical device 1300 may include battery/power circuitry 1314. The battery/power circuitry 1314 may include one or more energy storage devices (e.g., batteries or capacitors) and/or circuitry for coupling components of the electrical device 1300 to an energy source separate from the electrical device 1300 (e.g., AC line power).

The electrical device 1300 may include a display device 1306 (or corresponding interface circuitry, as discussed above). The display device 1306 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1300 may include an audio output device 1308 (or corresponding interface circuitry, as discussed above). The audio output device 1308 may include any embedded or wired or wirelessly connected external device that generates an audible indicator, such speakers, headsets, or earbuds.

The electrical device 1300 may include an audio input device 1324 (or corresponding interface circuitry, as discussed above). The audio input device 1324 may include any embedded or wired or wirelessly connected device that generates a signal representative of a sound, such as microphones, microphone arrays, or digital instruments (e.g., instruments having a musical instrument digital interface (MIDI) output). The electrical device 1300 may include a Global Navigation Satellite System (GNSS) device 1318 (or corresponding interface circuitry, as discussed above), such as a Global Positioning System (GPS) device. The GNSS device 1318 may be in communication with a satellite-based system and may determine a geolocation of the electrical device 1300 based on information received from one or more GNSS satellites, as known in the art.

The electrical device 1300 may include another output device 1310 (or corresponding interface circuitry, as discussed above). Examples of the other output device 1310 may include an audio codec, a video codec, a printer, a wired or wireless transmitter for providing information to other devices, or an additional storage device.

The electrical device 1300 may include another input device 1320 (or corresponding interface circuitry, as discussed above). Examples of the other input device 1320 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1300 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra-mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1300 may be any other electronic device that processes data. In some embodiments, the electrical device 1300 may comprise multiple discrete physical components. Given the range of devices that the electrical device 1300 can be manifested as in various embodiments, in some embodiments, the electrical device 1300 can be referred to as a computing device or a computing system.

While at least one embodiment has been presented in the foregoing detailed description, it should be appreciated that a vast number of variations exist. It should also be appreciated that the disclosed embodiments are only examples, and are not intended to limit the scope, applicability, or configuration of the disclosure in any way. Rather, the foregoing detailed description will provide those skilled in the art with a convenient road map for implementing the disclosed embodiments. Various changes can be made in the function and arrangement of elements without departing from the scope of the disclosure as set forth in the appended claims and the legal equivalents thereof.

As used herein, phrases such as "an embodiment," "various embodiments," "some embodiments," and the like, indicate that some embodiments may have some, all, or none of the features described for other embodiments. "First," "second," "third," and the like describe a common object and indicate different instances of like objects being referred to; unless specifically stated, they do not imply a given sequence, either temporally or spatially, in ranking, or any other manner. In accordance with patent application parlance, "connected" indicates elements that are in direct physical or electrical contact with each other and "coupled" indicates elements that co-operate or interact with each other, coupled elements may or may not be in direct physical or electrical contact. Furthermore, the terms "comprising," "including," "having," and the like, are utilized synonymously to denote non-exclusive inclusions.

As used in this application and the claims, a list of items joined by the term "at least one of" or the term "one or more of" can mean any combination of the listed terms. For example, the phrase "at least one of A, B or C" can mean A; B; C; A and B; A and C; B and C; or A, B, and C. Likewise, the phrase "one or more of A, B and C" can mean A; B; C; A and B; A and C; B and C; or A, B, and C.

As used in this application and the claims, the phrase "individual of" or "respective of" following by a list of items recited or stated as having a trait, feature, etc. means that all the items in the list possess the stated or recited trait, feature, etc. For example, the phrase "individual of A, B, or C, comprise a sidewall" or "respective of A, B, or C, comprise a sidewall" means that A comprises a sidewall, B comprises sidewall, and C comprises a sidewall.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

The following examples pertain to additional embodiments of technologies disclosed herein.

EXAMPLES

Example 1 is an apparatus, comprising: a dielectric layer having an upper surface that is characterized by surface variations of less than plus or minus 5 microns; a glass core located under the dielectric layer; a conductive pillar located within the dielectric layer and oriented substantially perpendicular to the upper surface; a conductive dome attached to the conductive pillar, the conductive dome having a radius that exceeds a radius of the conductive pillar; a solder resist layer located on the upper surface; and an opening in the solder resist layer that is substantially centered on the conductive dome.

Example 2 includes the subject matter of Example 1, wherein the conductive dome comprises nickel adjacent to the conductive pillar.

Example 3 includes the subject matter of Example 1, wherein the conductive dome comprises nickel, palladium, and gold.

Example 4 includes the subject matter of Example 1, wherein the conductive dome comprises nickel adjacent to the conductive pillar, palladium overlaid on the nickel, and gold overlaid on the palladium.

Example 5 includes the subject matter of Example 1, wherein a conductive dome radius exceeds a pillar radius by about 5 to 10 microns.

Example 6 includes the subject matter of Example 1, wherein a conductive dome height is substantially 7 microns.

Example 7 includes the subject matter of Example 1, further comprising a solder material located in the opening in the solder resist and in electrical connection with the conductive pillar through the conductive dome.

Example 8 includes the subject matter of Example 1, wherein the glass core comprises silicon and oxygen.

Example 9 includes the subject matter of Example 1, wherein the glass core comprises silicon, oxygen, and aluminum, boron, or an alkaline-earth metal.

Example 10 includes the subject matter of Example 1, wherein the glass core has a thickness in a range of about 20 microns to about 1 millimeter.

Example 11 includes the subject matter of Example 1, wherein the opening in the solder resist has a diameter that is smaller than a diameter of the conductive dome.

Example 12 includes the subject matter of Example 1, wherein the opening in the solder resist has a diameter that is larger than a diameter of the conductive dome.

Example 13 includes the subject matter of Example 1, wherein the opening in the solder resist has a tapered wall, with a smaller diameter near the conductive dome.

Example 14 includes the subject matter of Example 1, further comprising a silicon nitride adhesion layer between the dielectric layer and the solder resist layer.

Example 15 includes the subject matter of Example 1, wherein the conductive pillar is attached to the conductive dome on a first end, and further comprising a conductive layer attached to a second end of the conductive pillar.

Example 16 includes the subject matter of Example 15, wherein the conductive layer has a thickness in a range of about 1 micron to about 30 microns Example 17 includes the subject matter of Example 16, wherein the conductive layer and the conductive pillar comprise copper.

Example 18 is a substrate package, comprising: a substrate comprising: a glass core; a dielectric layer located on the glass core, the dielectric layer having an upper surface that is characterized by surface variations of less than plus or minus 5 microns; a conductive pillar located within the dielectric layer and oriented substantially perpendicular to the upper surface; a conductive dome, the conductive dome comprising nickel and attached to the conductive pillar, the conductive dome having a radius that exceeds a radius of the conductive pillar; a solder resist layer located on the upper surface; an opening in the solder resist layer that is substantially centered on the conductive dome; a solder material located in the opening in the solder resist and electrically connected to the conductive dome; and an integrated circuit die attached to the substrate via the solder material.

Example 19 includes the subject matter of Example 18, wherein the conductive dome further comprises palladium and gold.

Example 20 includes the subject matter of Example 18, wherein the conductive dome comprises nickel adjacent to the conductive pillar, palladium overlaid on the nickel, and gold overlaid on the palladium.

Example 21 includes the subject matter of Example 18, wherein a conductive dome radius exceeds a pillar radius by about 5 to 10 microns.

Example 22 includes the subject matter of Example 18, wherein a conductive dome height is substantially 7 microns.

Example 23 includes the subject matter of Example 18, further comprising a solder material located in the opening in the solder resist and in electrical connection with the conductive pillar through the conductive dome.

Example 24 includes the subject matter of Example 18, wherein the glass core comprises silicon and oxygen.

Example 25 includes the subject matter of Example 18, wherein the glass core comprises silicon, oxygen, and aluminum, boron, or an alkaline-earth metal.

Example 26 includes the subject matter of Example 18, wherein the glass core has a thickness in a range of about 20 microns to about 1 millimeter.

Example 27 includes the subject matter of Example 18, wherein the opening in the solder resist has a diameter that is smaller than a diameter of the conductive dome.

Example 28 includes the subject matter of Example 18, wherein the opening in the solder resist has a diameter that is larger than a diameter of the conductive dome.

Example 29 includes the subject matter of Example 18, wherein the opening in the solder resist has a tapered wall, with a smaller diameter near the conductive dome.

Example 30 includes the subject matter of Example 18, further comprising a silicon nitride adhesion layer between the dielectric layer and the solder resist layer.

Example 31 includes the subject matter of Example 18, wherein the conductive pillar is attached to the conductive dome on a first end, and further comprising a conductive layer attached to a second end of the conductive pillar.

Example 32 includes the subject matter of Example 31, wherein the conductive layer has a thickness in a range of about 1 micron to about 30 microns.

Example 33 includes the subject matter of Example 31, wherein the conductive layer and the conductive pillar comprise copper.

Example 34 is a method, comprising: fabricating a substrate having a dielectric layer comprising a conductive layer having a plurality of conductive contacts on a first surface; locating a pillar on at least one conductive contact of the plurality of conductive contacts; overlaying a dielectric layer above the first surface of the substrate; planarizing the dielectric layer to less than a plus or minus 5-micron surface variation; performing an electroless nickel electroless palladium immersion gold (ENEPIG) deposit on the at least one conductive contact; depositing and patterning solder resist over the planarized dielectric layer; and depositing solder material in an opening in the solder resist.

Example 35 includes the subject matter of Example 34, further comprising attaching an integrated circuit die to the substrate via the solder material.

Example 36 includes the subject matter of Example 34, wherein the dielectric layer is a first dielectric layer, and further comprising: locating the first dielectric layer on a glass core; and locating one or more additional dielectric layers comprising a respective one or more additional conductive layers between the glass core and the first dielectric layer.

What is claimed is:

1. An apparatus, comprising:

a dielectric layer having an upper surface that is characterized by surface variations of less than plus or minus 5 microns;

a glass core located under the dielectric layer;

a conductive pillar located within the dielectric layer and oriented substantially perpendicular to the upper surface;

a conductive dome attached to the conductive pillar at the upper surface, the conductive dome having a radius that exceeds a radius of the conductive pillar;

a solder resist layer located on the upper surface; and an opening in the solder resist layer that is substantially centered on the conductive dome.

2. The apparatus of claim 1, wherein the conductive dome comprises nickel adjacent to the conductive pillar.

3. The apparatus of claim 1, wherein a conductive dome radius exceeds a pillar radius by about 5 to 10 microns.

4. The apparatus of claim 1, wherein a conductive dome height is substantially 7 microns.

5. The apparatus of claim 1, further comprising a solder material located in the opening in the solder resist layer and in electrical connection with the conductive pillar through the conductive dome.

6. The apparatus of claim 1, wherein the glass core comprises silicon and oxygen.

7. The apparatus of claim 1, wherein the glass core has a thickness in a range of about 20 microns to about 1 millimeter.

8. The apparatus of claim 1, wherein the opening in the solder resist layer has a diameter that is smaller than a diameter of the conductive dome.

9. The apparatus of claim 1, wherein the opening in the solder resist layer has a diameter that is larger than a diameter of the conductive dome.

10. The apparatus of claim 1, wherein the opening in the solder resist layer has a tapered wall, with a smaller diameter near the conductive dome.

11. The apparatus of claim 1, further comprising a silicon nitride adhesion layer between the dielectric layer and the solder resist layer.

12. The apparatus of claim 1, wherein the conductive pillar is attached to the conductive dome on a first end, and further comprising a conductive layer attached to a second end of the conductive pillar, the conductive layer having a thickness in a range of about 1 micron to about 30 microns.

13. A substrate package, comprising:

a substrate comprising:

a glass core;

a dielectric layer located on the glass core, the dielectric layer having an upper surface that is characterized by surface variations of less than plus or minus 5 microns;

a conductive pillar located within the dielectric layer and oriented substantially perpendicular to the upper surface;

a conductive dome, the conductive dome comprising nickel and attached to the conductive pillar, the conductive dome having a radius that exceeds a radius of the conductive pillar;

a solder resist layer located on the upper surface;

an opening in the solder resist layer that is substantially centered on the conductive dome;

a solder material located in the opening in the solder resist layer and electrically connected to the conductive dome; and an integrated circuit die attached to the substrate via the solder material.

14. The substrate package of claim 13, wherein a conductive dome radius exceeds a pillar radius by about 5 to 10 microns.

15. The substrate package of claim 13, wherein a conductive dome height is substantially 7 microns.

16. The substrate package of claim 13, wherein the solder material is electrically connected to the conductive pillar through the conductive dome.

17. The substrate package of claim 13, further comprising a silicon nitride adhesion layer between the dielectric layer and the solder resist layer.

18. A method, comprising:

fabricating a substrate having a dielectric layer comprising a conductive layer having a plurality of conductive contacts on a first surface;

locating a pillar on at least one conductive contact of the plurality of conductive contacts;

overlaying the dielectric layer above the first surface of the substrate;

planarizing the dielectric layer to less than a plus or minus 5-micron surface variation;

performing an electroless nickel electroless palladium immersion gold (ENEPIG) deposit on the at least one conductive contact;

depositing and patterning solder resist over the planarized dielectric layer; and depositing solder material in an opening in the solder resist.

19. The method of claim 18, further comprising attaching an integrated circuit die to the substrate via the solder material.

20. The method of claim 19, wherein the dielectric layer is a first dielectric layer, and further comprising:

locating the first dielectric layer on a glass core; and locating one or more additional dielectric layers comprising a respective one or more additional conductive layers between the glass core and the first dielectric layer.

* * * * *